United States Patent [19]

Irvine et al.

[11] Patent Number: 6,144,254
[45] Date of Patent: Nov. 7, 2000

[54] LOW-NOISE AMPLIFIER WITH SWITCHED GAIN AND METHOD

[75] Inventors: Robert Grant Irvine, Plainsboro; Samuel Alfred Tiller, East Windsor, both of N.J.

[73] Assignee: Infineon Technologies Corporation, Cupertino, Calif.

[21] Appl. No.: 09/325,902

[22] Filed: Jun. 4, 1999

[51] Int. Cl.[7] .................................................. H03F 3/68
[52] U.S. Cl. ......................................... 330/51; 330/295
[58] Field of Search ............................. 330/51, 124 R, 330/129, 278, 285, 295

[56] References Cited

U.S. PATENT DOCUMENTS

| | | | |
|---|---|---|---|
| 3,748,588 | 7/1973 | Beurrier | 330/124 R X |
| 4,885,550 | 12/1989 | Ferrer | 330/295 X |
| 5,548,246 | 8/1996 | Yamamoto et al. | 330/51 |

*Primary Examiner*—Steven J. Mottola
*Attorney, Agent, or Firm*—Robert A. Whitman

[57] ABSTRACT

A low noise radio frequency amplifier is switchable between a low gain state and a high gain state. A first, common-emitter transistor is active in the high gain state and inactive in the low gain state. The first transistor has a base coupled to a radio frequency input and a first bias input, an emitter coupled to ground, and a collector coupled to an amplified radio frequency output. A second, common-base transistor is active in the low gain state and inactive in the high gain state. The second transistor has an emitter coupled to the radio frequency input, a base coupled to a second bias input, and a collector coupled to the amplified radio frequency output.

22 Claims, 3 Drawing Sheets

LOW-NOISE AMPLIFIER WITH SWITCHED GAIN AND METHOD

BACKGROUND OF INVENTION

The present invention relates to low noise amplifiers for use, for example, in radio frequency receivers.

Radio receivers typically receive a radio frequency (RF) signal, for example, via an antenna. The received RF signal is typically amplified and then sent to a mixer where the frequency is downconverted via a mixer to a lower frequency that is easier to process by the receiver. The amplifier should raise the level of the RF input signal above the equivalent input noise of the mixer so that an adequate signal to noise ratio is maintained. If, on the other is hand, the input signal is already of sufficiently high level, the amplifier should be switchable to a lower gain in order to relax the linearity requirements of the mixer.

RF amplification is commonly used in communication systems, such as in cellular communications and cordless telephony. For example, a handset receives a RF signal via an antenna, which is amplified before it is downconverted to an intermediate frequency (IF) signal via a mixer. It is important that the amplifier be low noise so that it does not significantly degrade or mask the information contained in the original RF signal. It is also important, particularly for cellular handsets, that the amplifier consumes low power. In addition, particularly for cellular handset applications, it is desirable that the amplifier has switchable gain. This is important because the RF signal received by the handset may be weak or strong, depending upon the location of the handset. For example, if the handset is at the edge of a cell, the RF signal it receives may be weak, requiring high amplification. In such situations, it is also important that a low noise amplifier is used to amplify the weak, low-power RF signal in order to distinguish the important information from surrounding low-level noise. On the other hand, if the handset is close to the center of a cell, the RF signal it receives may be strong, requiring little, if any, amplification. Moreover, any amplifier should be easy to manufacture, preferably as an integrated circuit.

Amplification techniques used to date, however, have shortcomings in performance and/or in implementation as an integrated circuit. For example, a conventional switched gain RF amplifier is shown in FIG. 1.

Here, a control voltage VCTL is used to switch the amplifier 10 between high gain and low gain modes. As explained further below, when the amplifier 10 is switched to low gain (VCTL low), FETs 14 and 16 provide a non-amplified bypass route for the RF signal. When the amplifier 10 is switched to high gain (VCTL high), cascaded FETs 18 and 19 provide amplification.

More particularly, VCTL is coupled to the base of npn transistor 12 and to the sources of FETs 14 and 16. The gates of FETs 14 and 16 are grounded. The drain of FET 14 is coupled to the RF input, and the drain of FET 16 is coupled to the RF output.

The emitter of transistor 12 is grounded and the collector of transistor 12 is coupled to the sources of amplification FETs 18 and 19. The gate of FET 18 is coupled to the RF input and the drain of FET 18 is coupled to the gate of FET 19. The drain of FET 19 is coupled to the RF output.

When VCTL is high, the amplifier is in high gain mode. More particularly, a high VCTL biases transistor 12 on, which provides a ground for the sources of amplification FETs 18 and 19, allowing them to amplify the RF input signal. Meanwhile, the sources of by bypass FETs 14 and 16 are high, turning them off. Nevertheless, even when off, bypass FETs 14 and 16 provide a capacitive feedback path from the RF output to the RF input. To lower the feedback capacitance, the circuit of FIG. 1 typically requires high-cost gallium arsenide FET implementation.

When VCTL is low, the amplifier is in low gain mode. The low signal biases bypass FETs 14 and 16 on, creating a no-gain bypass path from the RF input to the RF output through FETs 14 and 16. Meanwhile, transistor 12 is biased off, which biases FETs 18 and 19 off.

In the low gain state, the gain value of the amplifier of FIG. 1 is determined by the insertion loss of the bypass FETs 14 and 16 and other input circuitry. Thus, the gain is necessarily less than 0 dB, and the amplifier of FIG. 1 is not capable of producing a low gain greater than 0 dB or multiple stepped gains. Also, in the low gain mode, this amplifier has strict linearity requirements, which would typically require high cost gallium arsenide FET implementation.

Consequently, there is a need for a low noise amplifier that can be easily and inexpensively manufactured, for example, with low cost silicon bipolar technology. There is also a need for a low noise amplifier that, if desired, has a low gain state and, in some situations, more than two gain steps (e.g., high, low and intermediate).

SUMMARY OF THE INVENTION

A low noise, switched gain RF amplifier is provided. In the high gain state, the amplifier uses a common-emitter, npn transistor for amplification. In the low gain state, the amplifier switches to a common-base, npn transistor for lower amplification. In alternate embodiments, additional common-base transistors may be used to provide multiple gain steps.

More particularly, the amplifier has an RF signal input and an RF signal output. The input is coupled to the base of a common-emitter transistor and to the emitter of a common-base transistor. The collectors of both transistors are coupled to the RF output. The base of the common-emitter transistor is coupled to a first bias, Bias 1, and the base of the common-base transistor is coupled to a second bias, Bias 2. The emitter of the common-emitter transistor is coupled to common.

A third transistor that provides a current bias to the common-base transistor has its collector coupled to the emitter of the common-base transistor, its base coupled to a third bias, Bias 3, and its emitter coupled to common. The amplifier is placed in the high gain state by having Bias 1 high and Biases 2 and 3 low or floated. In this state, the common-emitter transistor is active and provides high gain amplification of the RF signal. The common-base and third transistor are both off.

The amplifier is placed in the low gain stage by having Bias 2 and 3 high, and Bias I floated. In this state, the common-base transistor and the third transistor are active. The common-emitter transistor is off. In this state, the common-base transistor provides low amplification of the RF signal.

Consequently, the amplifier of the present invention provides both high and low amplification stages. Preferably, the inactive stage is completely turned off when the other stage is active so that it does not interfere with the operation of the active stage. The low noise amplifier of the present invention is advantageously easy to manufacture as an integrated circuit, preferably using low cost silicon bipolar transistor technology.

In an alternative embodiment, a second common-base transistor having its base coupled to a fourth bias, Bias 4, is coupled in parallel with the first common-base transistor. Such a transistor provides a further gain step when its bias is high, Bias 2 to the first common-base amplifier is low or floated, and Bias 1 to the common-emitter transistor is floated. Additional common-base stages could also be added to implement additional gain steps.

DETAILED DESCRIPTION OF THE PREFERRED EMBODIMENTS

Figure 1:
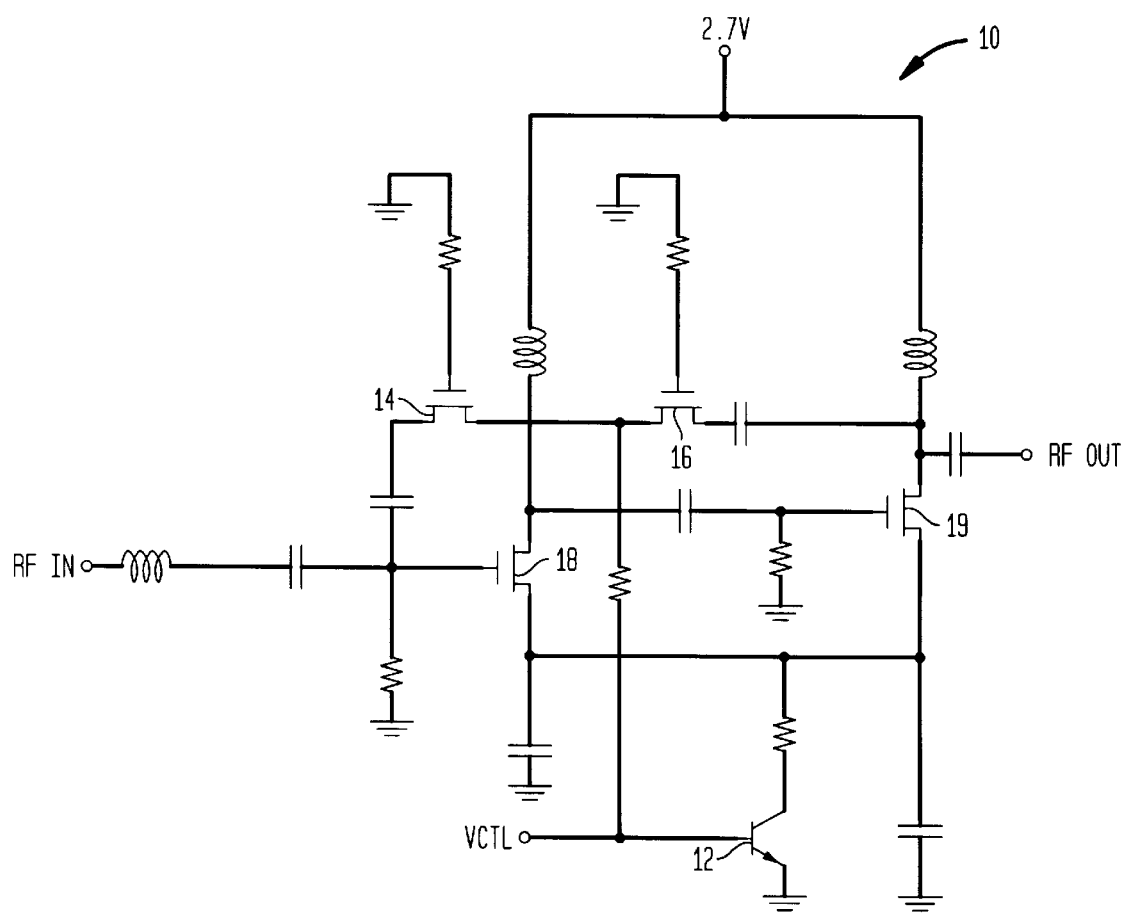
FIG. 1 is a circuit diagram of a known amplifier.
Figure 2:
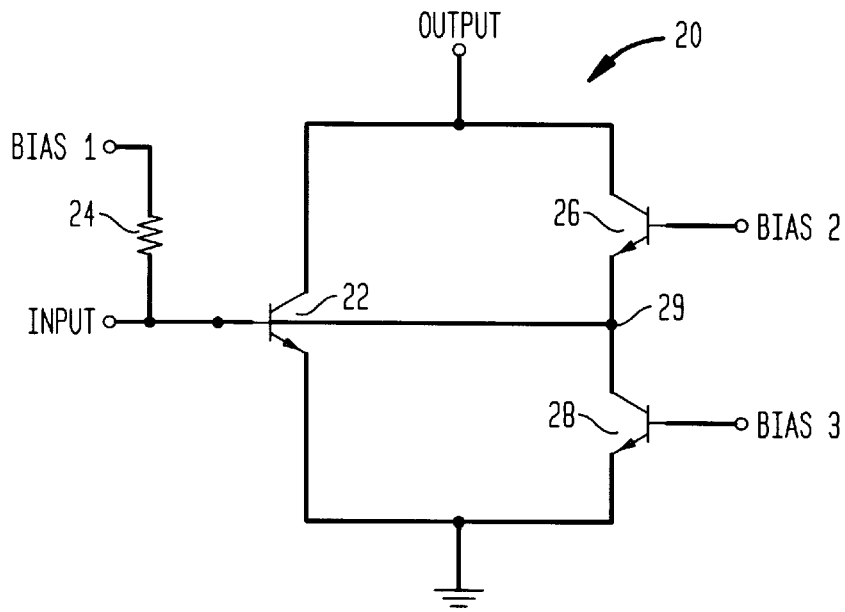
FIG. 2 is a circuit diagram of a first embodiment of a low noise, switched gain amplifier in accordance with the present invention.

Referring to FIG. 2, a first embodiment of a low noise, switched gain amplifier 20 of the present invention is shown. A radio frequency input signal is input to the base of common-emitter npn transistor 22. The emitter of transistor 22 is coupled to ground. Transistor 22 is biased via resistor 24 and bias voltage Bias 1. The collector of transistor 22 is coupled to the radio frequency Output.

The collector of a second npn transistor 26 is also coupled to the Output. The base of transistor 26 is coupled to a second voltage bias, Bias 2. A third npn transistor 28 is provided. The collector of transistor 28 is coupled to the emitter of transistor 26 and to the base of transistor 26 at a junction 29. The emitter of transistor 28 is grounded. The base of transistor 28 is coupled to a third voltage bias, Bias 3.

When amplifier 20 is in the high gain state, Bias 1 is high and Biases 2 and 3 are grounded or floated. Consequently, transistors 26 and 28 are turned off and transistor 22 acts as a common-emitter amplifier. The input RF signal is amplified by transistor 22 and is output via transistor 22's collector to the amplified RF Output.

When amplifier 20 is in the low gain state, Bias 2 and Bias 3 are high and Bias 1 is floated. Here, transistor 28, which is active, provides a bias current for transistor 26. Bias 2 is selected to provide a DC voltage that, at the Input, is low enough to switch transistor 22 off and high enough to avoid saturation of transistor 28. A DC input voltage of about 420 mV is preferred.

In the low gain state, transistor 26 acts as a common-base amplifier, which, at a given current, provides less power gain than a common-emitter amplifier since it has lower input impedance.

Consequently, amplifier 20 is switchable between high and low gain states. In the high gain state, amplifier 20 uses a common-emitter npn bipolar transistor 22 for high amplification. In the low gain state, transistor 22 is turned off and amplifier 20 switches to common-base npn bipolar transistor 26 for low amplification. Moreover, the high and low gain switching occurs such that, in each gain state, the inactive stage is completely turned off so that it does not interfere with the operation of the active stage. Consequently, the circuit of FIG. 2 provides low-noise amplification and is switchable between high gain and low gain states. In addition, the amplifier can be easily and inexpensibly manufactured as an integrated circuit using bipolar transistors. Moreover, the two stages (common-emitter and common-base) can be easily operated at different currents, enabling a wide range of gain values and gain steps.

Figure 3:
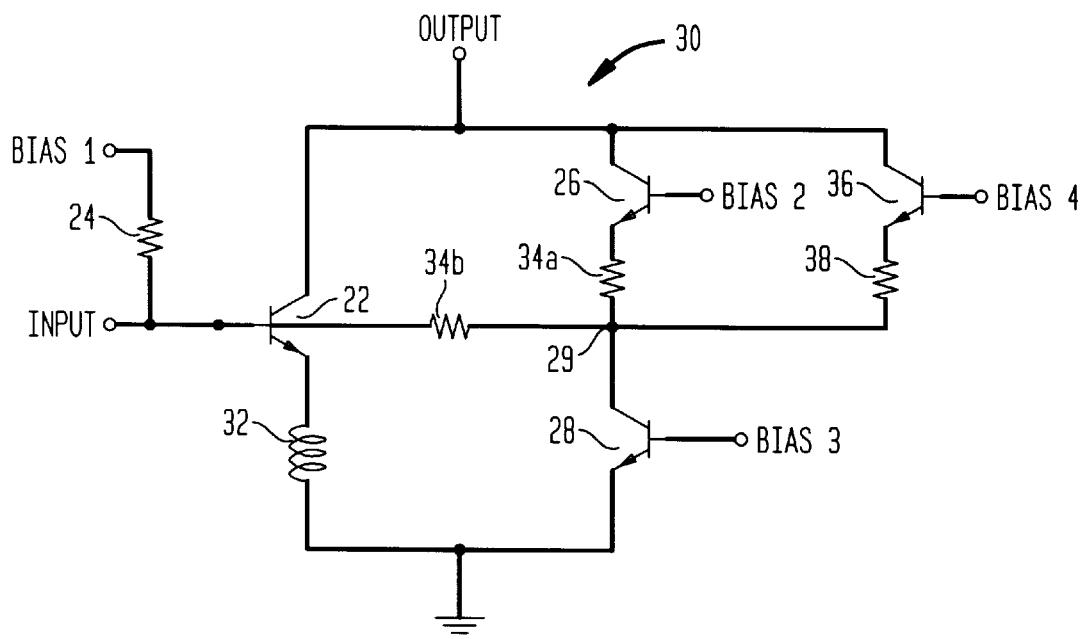
FIG. 3 is a circuit diagram of a second embodiment of low noise, switched gain amplifier in accordance with the present invention.

Turning to FIG. 3, a second embodiment of a low noise, switched gain amplifier 30 is shown. Like reference numerals for like components will be used throughout for clarity and simplification purposes.

Here, an optional inductor 32 is coupled between the emitter of transistor 22 and ground. Inductor 32 provides emitter degeneration, which improves linearity when amplifier 30 is in the high gain state. Of course, other types of impedances (not shown) coupled between the emitter of transistor 22 and ground would also improve high gain linearity.

An optional resistor 34a is coupled between the Input and junction 29. Resistor 34a provides emitter degeneration for transistor 26, which improves linearity when the amplifier 30 is in the low gain state. Optional resistor 34b also provides emitter degeneration for transistor 26, thereby improving linearity in the low gain state. In addition, resistor 34b improves noise by reducing the amount of collector current noise from transistor 28. Of course, other types of emitter degeneration impedances can be used.

An optional fourth npn transistor 36 is shown having its base connected to a voltage bias, Bias 4, its collector connected to the Output, and its emitter connected to junction 29 (via optional resistor 38). Transistor 36 acts as an additional low amplification, common-base amplifier stage to the allow another gain setting for amplifier 30. Optional resistor 38 acts as an emitter degeneration impedance that improves the linearity of amplifier 30 when it is in its second low gain state. Variable gain steps can be easily achieved by varying biases and/or resistors 34 and 38, and the like. Of course, additional common-base transistor stages could be added to allow even further gain settings.

Figure 4:
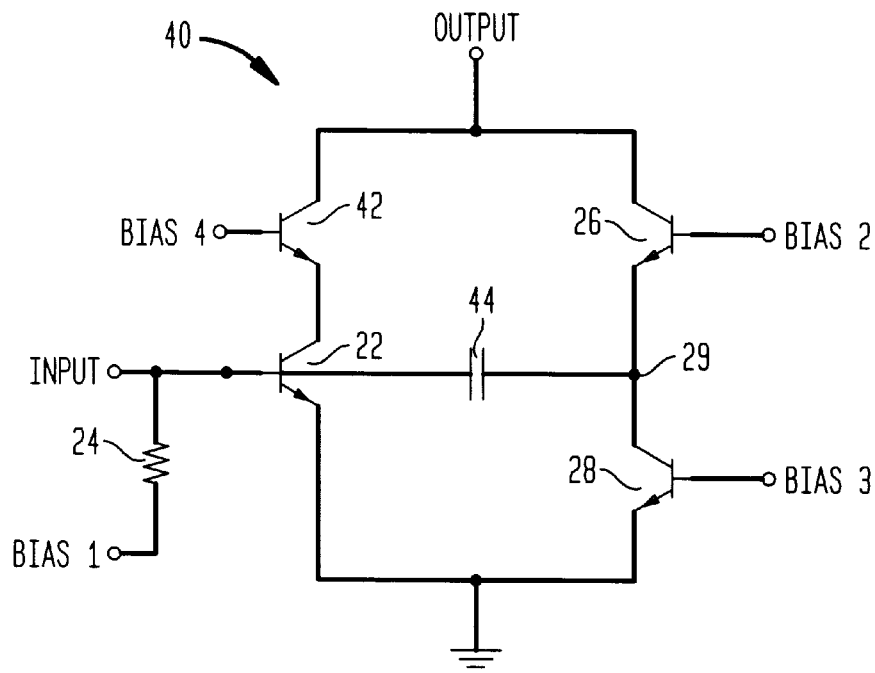
FIG. 4 is a circuit diagram of a third embodiment of a low noise, switched gain amplifier in accordance with the present invention.

Turning to FIG. 4, a third embodiment of an amplifier 40 is shown. Here, an optional fourth transistor 42 is added having its base coupled to a fourth voltage bias, Bias 4, its emitter connected to the collector of transistor 22, and its collector connected to the Output. Thus, transistors 22 and 42 provide a cascoded transistor amplifier pair when the amplifier is in the high gain state, which increases the gain of amplifier 40.

An optional capacitor 44 is shown connected between the base of transistor 22 and junction 29. In the low gain state, this capacitor allows the DC emitter voltage of the common base amplifier 26 to be less critical to the operation of the amplifier 40 by removing the DC coupling between the transistors.

Figure 5:
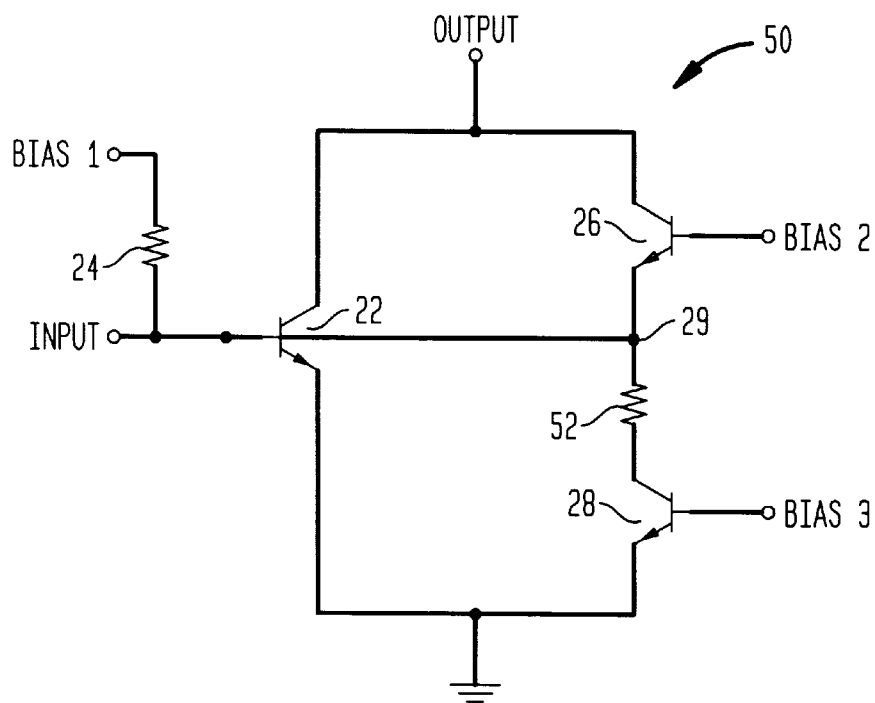
FIG. 5 is a circuit diagram of a fourth embodiment of a low noise, switched gain amplifier in accordance with the present invention.

Turning to FIG. 5, a fourth embodiment of an amplifier 50 in accordance with the present invention is shown. Here, transistor 28 is intended to be operated in the saturated mode, instead of as a current source. Series resistor 52 defines the bias current for transistor 26. This implementation can reduce the noise figure of the amplifier because a transistor operated in the switched mode typically has less noise than an active transistor.

Of course any of the multiple embodiments described and illustrated above, or any particular feature of the embodiments, can be used alone or in combination as desired. Similarly, it will be well understood that npn transistors are shown as the preferred embodiment only, and pnp or FET transistors, for example, can be readily substituted.

The foregoing is considered as illustrative only of the principles of the preferred embodiments of the present invention. Further, since numerous modifications and changes will readily occur to those skilled in the art, it is not desired to limit the invention to the exact construction and applications shown and described, and accordingly, all suitable modifications and equivalents may be regarded as falling within the spirit and scope of invention in the appended claims, the scope of the invention being set forth in the appended claims.

What is claimed is:

1. A radio frequency amplifier having a low gain state and a high gain state comprising:
   a first transistor active in the high gain state and inactive in the low gain state, said first transistor having a base coupled to a radio frequency input and a first bias input, an emitter coupled to ground, and a collector coupled to an amplified radio frequency output; and
   a second transistor active in the low gain state and inactive in the high gain state, said second transistor having an emitter coupled to said radio frequency input, a base coupled to a second bias input, and a collector coupled to said amplified radio frequency output.

2. The amplifier of claim 1 further comprising a third transistor having a base coupled to a third bias input, an emitter coupled to ground and a collector coupled to the emitter of the second transistor.

3. The amplifier of claim 1 wherein the emitter of the first transistor is coupled to ground via an impedance.

4. The amplifier of claim 1 further comprising an impedance coupled between the emitter of the second transistor and the radio frequency input.

5. The amplifier of claim 1 wherein the emitter of the second transistor is capacitively coupled to the radio frequency input.

6. The amplifier of claim 2 further comprising a fourth transistor having a base coupled to a fourth bias input, an emitter coupled to the collector of the first transistor and a collector coupled to the amplified radio frequency output.

7. The amplifier of claim 2 further comprising an impedance coupled between the emitter of the second transistor and the collector of the third transistor.

8. The amplifier of claim 2 further comprising a fourth transistor having a base coupled to a fourth bias input, a collector coupled to the amplified radio frequency output and an emitter coupled to the emitter of the second transistor.

9. The amplifier of claim 8 wherein the emitters of the second and fourth transistors are coupled at a junction, and further comprising a first impedance coupled between the emitter of the second transistor and the junction and a second impedance coupled between the emitter of the fourth transistor and the junction.

10. The amplifier of claim 9 further comprising an impedance coupled between the junction and the radio frequency input.

11. The amplifier of claim 9 further comprising a capacitance coupled between the junction and the radio frequency input.

12. The amplifier of claim 8 wherein the emitter of the first transistor is coupled to ground via an impedance.

13. The amplifier of claim 9 wherein the emitter of the first transistor is coupled to ground via an impedance.

14. The amplifier of claim 8 wherein the first, second, third and fourth transistors are NPN bipolar transistors.

15. The amplifier of claim 1 wherein the first and second transistors are NPN bipolar transistors.

16. A method of amplifying a radio frequency signal comprising the steps of:
   amplifying said radio frequency signal using a high-gain, common-emitter transistor;
   switching said high-gain common-emitter transistor off; and
   amplifying said radio frequency signal using a low-gain, common-base transistor.

17. The method of claim 16 further comprising the steps of:
   switching said low-gain, common-base transistor off, and
   amplifying said radio frequency signal using said high-gain, common-emitter transistor.

18. The method of claim 16 further comprising the steps of:
   switching said low-gain, common-base transistor off, and
   amplifying said radio frequency signal using an intermediate-gain, common-base transistor.

19. A switched gain radio frequency amplifier, comprising:
   a radio frequency input and an amplified radio frequency output;
   high amplification means coupled to said radio frequency input and coupled to said radio frequency output;
   low amplification means coupled to said radio frequency input and coupled to said radio frequency output;
   intermediate amplification means coupled to said radio frequency input and coupled to said radio frequency output; and
   control means for switching between said high, low and intermediate amplification means.

20. The amplifier of claim 19 wherein said low amplification means comprises an NPN common-base bipolar transistor.

21. A switched gain radio frequency amplifier, comprising:
   a radio frequency input and an amplified radio frequency output;
   high amplification means coupled to said radio frequency input and coupled to said radio frequency output;
   low amplification means comprising an NPN common-base bipolar transistor coupled to said radio frequency input and coupled to said radio frequency output; and
   control means for switching between said high and low amplification means.

22. A switched gain radio frequency amplifier, comprising:
   a radio frequency input and an amplified radio frequency output;
   a high-gain amplifier having an input coupled to said radio frequency input and an output coupled to said radio frequency output, and having an input coupled to a first bias signal;
   a low-gain amplifier comprising an NPN common-base bipolar transistor having an input coupled to said radio frequency input and an output coupled to said radio frequency output, and having an input coupled to a second bias signal;
   said high and low gain amplifiers having an active state and an inactive state;
   said first bias signal for switching said high gain amplifier between said active and inactive state; and
   said second bias signal for switching said low gain amplifier between said active and inactive state.

* * * * *